(12) United States Patent
Eleyan et al.

(10) Patent No.: US 6,574,160 B1
(45) Date of Patent: Jun. 3, 2003

(54) MECHANISM TO MINIMIZE FAILURE IN DIFFERENTIAL SENSE AMPLIFIERS

(75) Inventors: Nadeem N. Eleyan, Austin, TX (US); Howard L. Levy, Cedar Park, TX (US); Jeffrey Y. Su, Cedar Park, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/074,396

(22) Filed: Feb. 11, 2002

(51) Int. Cl.[7] .................................................. G11C 7/02

(52) U.S. Cl. .................... 365/207; 365/205; 365/230.06

(58) Field of Search ................................ 365/207, 205, 365/230.06

(56) References Cited

U.S. PATENT DOCUMENTS

| | | | | |
|---|---|---|---|---|
| 5,539,700 A | * | 7/1996 | Kawahara et al. | 365/203 |
| 5,710,737 A | * | 1/1998 | Komiya et al. | 365/201 |
| 6,101,141 A | * | 8/2000 | Schoniger et al. | 365/207 |
| 6,442,099 B1 | * | 8/2002 | Kant et al. | 365/230.03 |

* cited by examiner

*Primary Examiner*—Hoai Ho
*Assistant Examiner*—Connie C. Yoha
(74) *Attorney, Agent, or Firm*—Blakely, Sokoloff, Taylor and Zafman, LLP

(57) ABSTRACT

According to one embodiment, a memory is disclosed. The memory includes a differential sense amplifier that receives a data input and a complementary data input; and a switching mechanism, coupled to the amplifier, that switches the data input and the complementary data input to minimize a negative bias temperature instability (NBTI) effect on the amplifier.

27 Claims, 4 Drawing Sheets

MECHANISM TO MINIMIZE FAILURE IN DIFFERENTIAL SENSE AMPLIFIERS

FIELD OF THE INVENTION

The present invention relates to memory devices; more particularly, the present invention relates to sense amplifiers.

BACKGROUND

In the design of differential sense amplifiers for memories, extreme care is taken to make sure that all device and parasitic parameters match perfectly on each side of the amplifier. Differential sense amplifiers are designed to detect minute differences in either voltage or current between true and false signals from information being read from a memory cell.

If there is any sort of mismatch between the true and false sides of the amplifier, the resulting output may incorrectly flip in the opposite direction to the value that needs to be read. In other words, the output may read a logic 1 instead of the actual logic 0 that is stored in the particular memory cell, or vice versa.

Typically the only way to fix such an occurrence is to introduce more delay into the signal that evaluates the sense amplifier, thus causing reduction in performance. In addition, since the signal is usually self-timed, rather than cycle dependent, if the mismatch in silicon is greater than expected during the time of the design, the amplifier will not operate at any frequency of the system clock.

In newer small-scale device technologies, a phenomenon called negative bias temperature instability (NBTI) causes the threshold voltage of PMOS devices to increase by a certain voltage level depending upon the historical amount of voltage bias that is observed between the gate and source/drain nodes of a device.

In the case of sense amplifiers, if the same data value is read repeatedly, one PMOS device of the amplifier will see the maximum NBTI voltage threshold shift, while the other PMOS device observes no shift. Consequently, a mismatch between the true and false sides of the amplifier will likely occur. As described above, such a mismatch causes failures in reading data from a memory.

SUMMARY

According to one embodiment, a computer system is disclosed. The computer system includes a microprocessor, a memory controller coupled to the microprocessor and a memory coupled to the memory controller. The memory includes a differential sense amplifier that receives a data input and a complementary data input; and a switching mechanism, coupled to the amplifier, that switches the data input and the complementary data input to minimize a Negative Bias Temperature Instability (NBTI) effect on the amplifier.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A mechanism to minimize failure in differential sense amplifiers due to Negative Bias Temperature Instability (NBTI) is described. In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
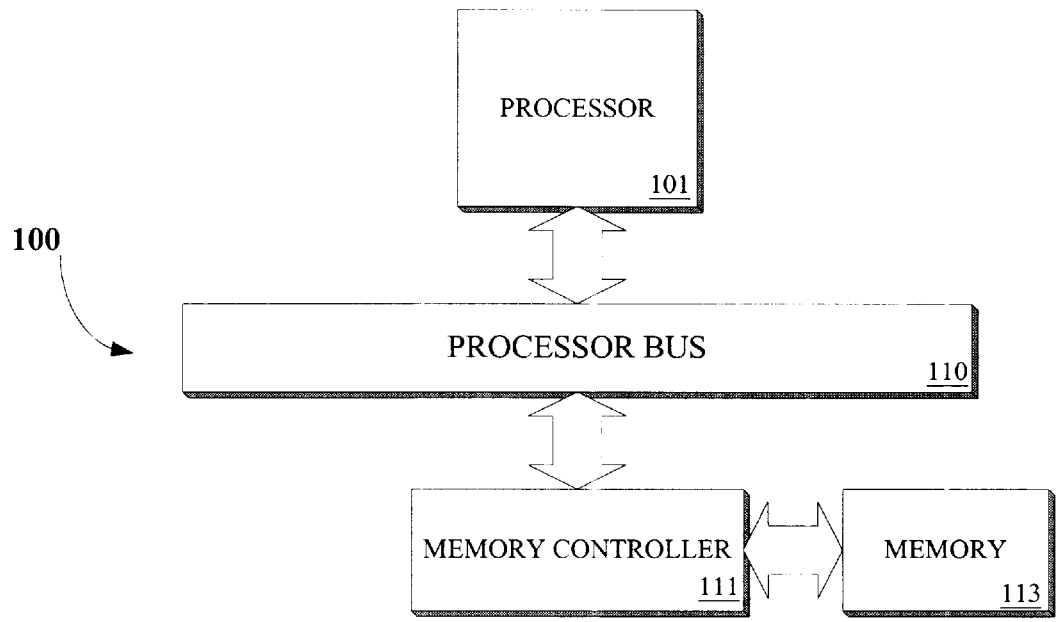
FIG. 1 is a block diagram of one embodiment of a computer system.

FIG. 1 is a block diagram of one embodiment of a computer system 100. Computer system 100 includes a processor 101 that processes data signals. Processor 101 may be a complex instruction set computer (CISC) microprocessor, a reduced instruction set computing (RISC) microprocessor, a very long instruction word (VLIW) microprocessor, a processor implementing a combination of instruction sets, or other processor device.

FIG. 1 shows an example of a computer system 100 employing a single processor computer. However, one of ordinary skill in the art will appreciate that computer system 100 may be implemented using multiple processors. Processor 101 is coupled to a processor bus 110. Processor bus 110 transmits data signals between processor 101 and other components in computer system 100. Computer system 100 also includes a memory 113. In one embodiment, memory 113 is a dynamic random access memory (DRAM) device. However, in other embodiments, memory 113 may be a static random access memory (SRAM) device, or other memory device.

Memory 113 may store instructions and code represented by data signals that may be executed by processor 101. Computer system 100 further comprises a bridge memory controller 111 coupled to processor bus 110 and memory 113. Memory controller 111 directs data signals between processor 101, memory 113, and other components in computer system 100 and bridges the data signals between processor bus 110 and memory 113.

Figure 2:
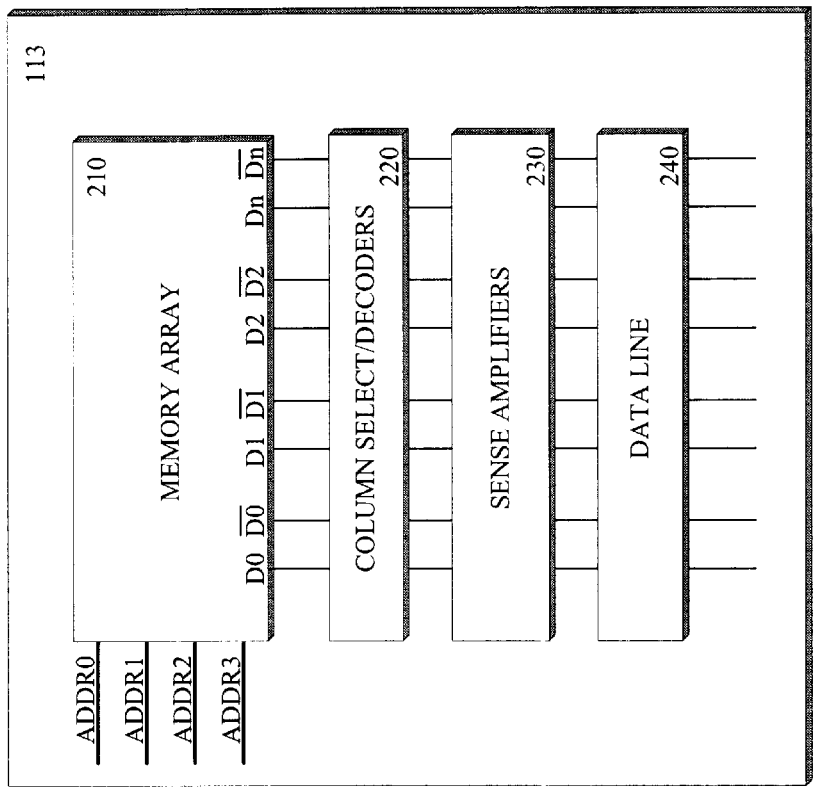
FIG. 2 is a block diagram of one embodiment of a memory device.

FIG. 2 illustrates one embodiment of memory 113. Memory 113 includes memory array 210, column selectors/decoders 220, sense amplifiers 230 and data line 240. Memory array 210 comprises a multitude of memory cells that store data and instructions that can be quickly accessed by processor 101. In one embodiment, memory array 210 comprises 16 rows and 16 columns of memory cells. However, memory array 210 may comprise a variety of magnitudes of memory cell rows and columns. Each column has a data line and a complement data line. Address lines (ADDR0–ADDR3) are coupled to memory cells 210 in order to select a row to be accessed.

Figure 4:
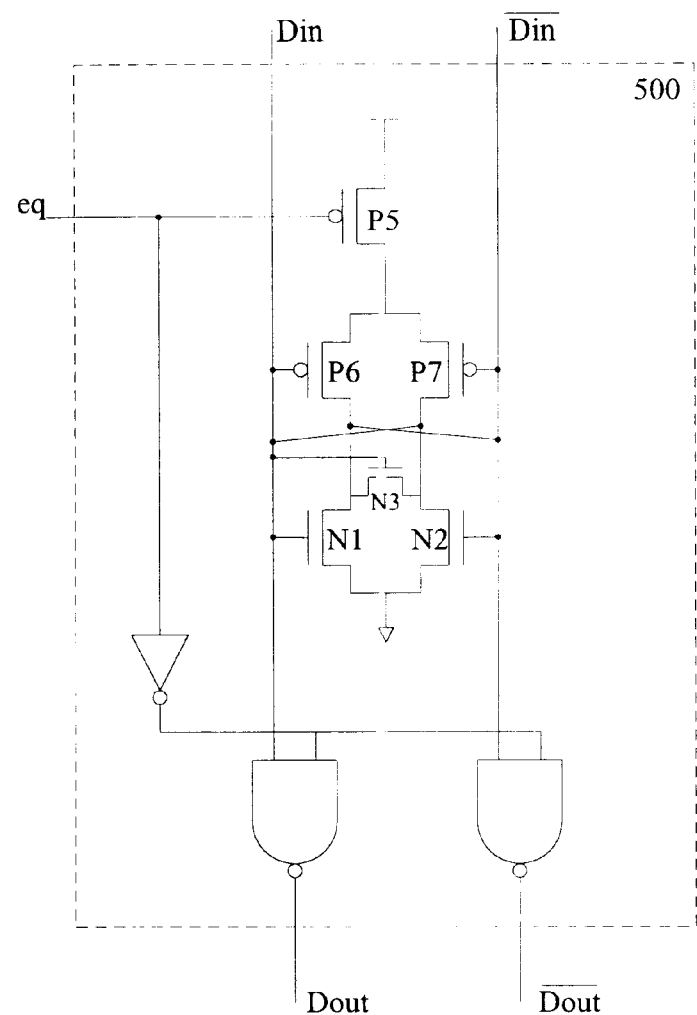
FIG. 4 illustrates one embodiment of a differential sense amplifier.

Column selectors/decoders 220 is coupled to memory array 230. Column selectors/decoders 220 is decoding circuitry used to decode a column address of memory array 210. Data line 240 is an input/output (I/O) bus where data is read and written to. Sense amplifiers 230 are coupled between column selectors/decoders 220 and data line 240. Sense amplifiers detect differences between the data signals and their complements. FIG. 4 illustrates one embodiment of a sense amplifier circuit 400.

Referring to FIG. 4, sense amplifier circuit 400 includes NMOS transistors N1, N2 and N3, PMOS transistors P5–P7, two NAND gates and an inverter. The gates of transistors N1 and P6 are coupled to the data line $D_{in}$, while the gates of transistors N2 and P7 are coupled to the complement data line. The source of transistors P6 and P7 are coupled to the drain of transistor P5. The drains of transistors P6 and P7 are coupled to the drains of transistors N1 and N2, respectively. The sources of transistors N1 and N2 are coupled to ground.

The source of transistor P5 is coupled to a supply voltage. The gates of transistors P5 and N3 are coupled to a sense amplifier equalization signal (eq). The source and drain of transistor N3 are coupled to the data signal $D_{in}$ and the complement data line, respectively. The eq signal is inverted by the inverter and supplied to an input of both NAND gates. In addition, one NAND gate receives the data signal $D_{in}$ at its second input, while the second NAND gate receives the complement of the data signal at its second input.

Sense amplifier circuit 400 is a small-scale device that may experience errors attributed to NBTI, which causes the threshold voltage of transistors P6 and P7 to increase by up to 50 mV depending upon the historical amount of voltage bias observed by the transistors between the respective gates. In particular, if the same data value (e.g., logic 0 or logic 1) is read repeatedly at, for example transistor P6, transistor P6 will remain on for a long period of time, while transistor P7 remains off.

The threshold voltage for transistor P6 would increase, while the threshold voltage for transistor P7 would remain constant. Consequently, the difference in threshold voltage between transistors P6 and P7 would cause sense amplifier 400 to malfunction. Thus, data readings from memory 113 will become inaccurate.

According to one embodiment, a switching mechanism is coupled before and after sense amplifier 400 in order to minimize the NBTI effect. The switching mechanism swaps values received at the data line and complement data line before and after sense amplifier 400 in order to ensure that a mixture of logic 0s and logic 1s are read by sense amplifier 400. As a result, transistors P6 and P7 will be used an equal magnitude of time.

Figure 3:
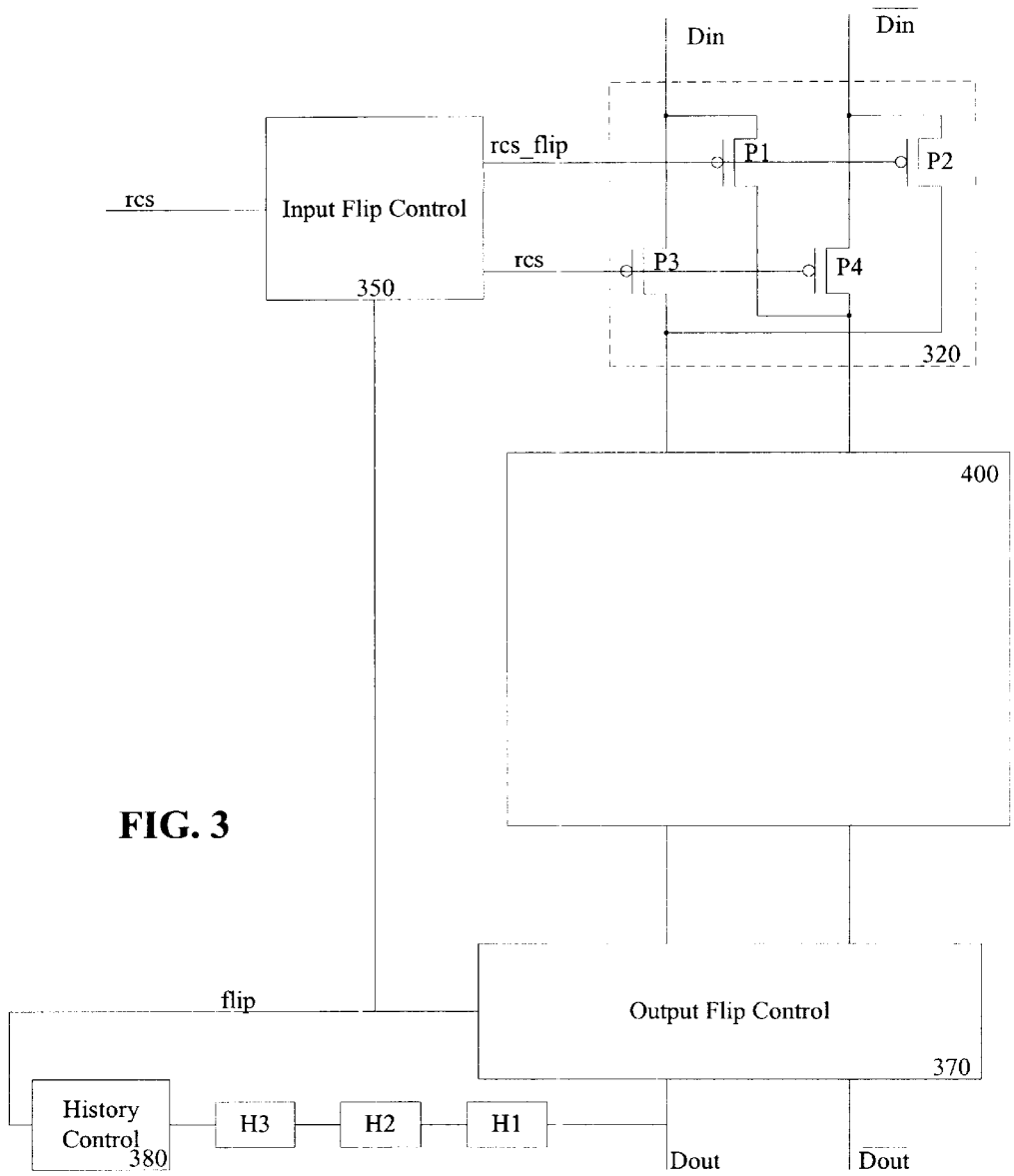
FIG. 3 illustrates one embodiment of a switching mechanism.

FIG. 3 illustrates one embodiment of a switching mechanism. According to one embodiment, the switching mechanism is coupled to each column of memory array 210 (FIG. 2). The switching mechanism includes column select/decode circuitry 320, sense amplifier 400, input flip control 350, output flip control 370, history control circuitry 380 and associated history registers (H1–H3).

Column select/decode circuitry 320 is coupled to select circuitry 310 via the data line and the complement data line. As described above, column select/decode circuitry is used to decode a column address of memory array 210. Column select/decode circuitry 320 includes PMOS transistors P1–P4.

According to one embodiment, transistors P1 and P2 are transistors used to flip the incoming data and transistors P3 and P4 are transistors for transmitting the true data. Whenever un-switched data is being transmitted to sense amplifier 400, transistors P3 and P4 are selected. However, whenever history control circuitry 380 determines that the data is to be flipped, transistors P1 and P2 are selected, thus transmitting the opposite data to sense amplifier 400.

Input flip control 350 is coupled to column select/decode circuitry 320. Input flip control 350 is multiplexing circuitry that selects whether true data or flipped data is transmitted to sense amplifier 400 based upon the status of a flip signal received from history control circuitry 380. Input flip control 350 receives a read column select (rcs) signal from memory controller 111.

Input flip control 350 has rcs and rcs__flip outputs that are coupled to column select/decode circuitry 320. The rcs__flip signal is coupled to the gates of transistors P1 and P2, while the rcs signal is coupled to the gates of transistors P3 and P4. Whenever rcs__flip is selected by input flip control 350, transistors P1 and P2 are activated, and the flipped data is transmitted to sense amplifier 400. Whenever rcs is selected, transistors P3, and P4 are activated, and true data is transmitted to sense amplifier 400.

Output flip control 370 is implemented to switch flipped data back to true format after the data is received from sense amplifier 400. Accordingly, if the data has been flipped at select/decode circuitry 320, the data is flipped back at output flip control 370. The data is flipped at output flip control 370 based upon the status of the flip signal. In one embodiment, output flip control 370 is implemented using a multiplexer. However, in other embodiments, other circuitry may be used to implement output flip control 370.

History control circuitry 380 is coupled to output flip control via history registers (H1–H3). History control circuitry 380 samples the output of output flip control 370 over three clock cycles by monitoring the data values stored in registers H1–H3. History control circuitry 380 selects the instances at which the data inputs to sense amplifier 400 will be switched. According to one embodiment, history control circuitry 380 transmits the flip signal to input flip control 350 and output flip control 370.

In a further embodiment, if the content of the history registers all include the same value (e.g., logic 0), history control circuitry 380 predicts that memory 113 is in a long string of that value, and transmits the flip signal to input control 350 and output control 370 in order to flip the data entering sense amplifier 400. If the content of history registers are mixed (e.g., 0-1-0), history control circuitry 380 averages the values and continues to monitor the history registers.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

What is claimed is:

1. A memory comprising:
    a differential sense amplifier that receives a data input and a complementary data input; and
    a switching mechanism, coupled to the amplifier, that switches the data input and the complementary data input during a regular operation of the memory to minimize a negative bias temperature instability (NBTI) effect on the amplifier.

2. The memory of claim 1 wherein the switching mechanism comprises:
   an input flip control; and
   an output flip control coupled to the input flip control.

3. The memory of claim 2 further comprising column decode circuitry coupled to the input flip control and the amplifier.

4. The memory of claim 3 wherein the column decode circuitry comprises:
   a first PMOS transistor and a second PMOS transistor coupled to a first output of the input flip control; and
   a third PMOS transistor and a fourth PMOS transistor coupled to a second output of the input flip control.

5. The memory of claim 4 wherein the data input and the complementary data input to the amplifier is switched whenever the first PMOS transistor and the second PMOS transistor are activated by the first output of the input flip control.

6. The memory of claim 2 further comprising:
   one or more history registers coupled to the output flip control; and
   a history control, coupled to the history registers and the input flip control.

7. The memory of claim 6 wherein the history control generates a flip signal that is transmitted to the input flip control and the output flip control in order to switch the data input and the complementary data input to the amplifier.

8. The memory of claim 4 further comprising a memory array coupled to the column decode circuitry.

9. A computer system comprising:
   a central processing unit (CPU);
   a memory controller coupled to the CPU; and
   a memory, coupled to the memory controller, including:
      a differential sense amplifier that receives a data input and a complementary data input; and
      a switching mechanism, coupled to the amplifier, that switches the data input and the complementary data input during a regular operation of the memory to minimize a negative bias temperature instability (NBTI) effect on the amplifier.

10. The computer system of claim 9 wherein the switching mechanism comprises:
    an input flip control; and
    an output flip control coupled to the input flip control.

11. The computer system of claim 10 further comprising column decode circuitry coupled to the input flip control and the amplifier.

12. The computer system of claim 11 wherein the column decode circuitry comprises:
    a first PMOS transistor and a second PMOS transistor coupled to a first output of the input flip control; and
    a third PMOS transistor and a fourth PMOS transistor coupled to a second output of the input flip control.

13. The computer system of claim 12 wherein the data input and the complementary data input to the amplifier is switched whenever the first PMOS transistor and the second PMOS transistor are activated by the first output of the input flip control.

14. The computer system of claim 10 further comprising:
    one or more history registers coupled to the output flip control; and
    a history control, coupled to the history registers and the input flip control.

15. The computer system of claim 14 wherein the history control generates a flip signal that is transmitted to the input flip control and the output flip control in order to switch the data input and the complementary data input to the amplifier.

16. The computer system of claim 12 further comprising a memory array coupled to the column decode circuitry.

17. A memory comprising:
    a differential sense amplifier that receives a data input and a complementary data input; and
    means, coupled to the amplifier, to switch the data input and the complementary data input during a regular operation of the memory to minimize a negative bias temperature instability (NBTI) effect on the amplifier.

18. The memory of claim 17 wherein the switching means comprises:
    an flip input flip control; and
    an output flip control coupled to the input flip control.

19. The memory of claim 18 further comprising column decode circuitry coupled to the input flip control and the amplifier.

20. The memory of claim 19 wherein the column decode circuitry comprises:
    a first PMOS transistor and a second PMOS transistor coupled to a first output of the input flip control; and
    a third PMOS transistor and a fourth PMOS transistor coupled to a second output of the input flip control.

21. The memory of claim 20 wherein the data input and the complementary data input to the amplifier is switched whenever the first PMOS transistor and the second PMOS transistor are activated by the first output of the input flip control.

22. The memory of claim 18 further comprising:
    one or more history registers coupled to the output flip control; and
    a history control, coupled to the history registers and the input flip control.

23. The memory of claim 22 wherein the history control generates a flip signal that is transmitted to the input flip control and the output flip control in order to switch the data input and the complementary data input to the amplifier.

24. The memory of claim 20 further comprising a memory array coupled to the column decode circuitry.

25. The memory of claim 1 wherein the input and output flip controls switch substantially simultaneously.

26. The computer system of claim 9 wherein the input and output flip controls switch substantially simultaneously.

27. The memory of claim 17 wherein the input and output flip controls switch substantially simultaneously.

* * * * *